United States Patent
Torres, Jr. et al.

(10) Patent No.: US 12,261,240 B2
(45) Date of Patent: Mar. 25, 2025

(54) LASER REMOVAL OF DEFECTS IN A DIELECTRIC FOR MODULATING AN ADJOINING ATOMICALLY TWO-DIMENSIONAL MATERIAL

(71) Applicant: United States of America as represented by the Secretary of the Navy, San Diego, CA (US)

(72) Inventors: Carlos Manuel Torres, Jr., San Diego, CA (US); Brad Chun-Ting Liu, San Diego, CA (US); Bienvenido Melvin L. Pascoguin, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 819 days.

(21) Appl. No.: 17/123,306

(22) Filed: Dec. 16, 2020

(65) Prior Publication Data
US 2022/0190195 A1 Jun. 16, 2022

(51) Int. Cl.
*H01L 33/00* (2010.01)
*B23K 26/53* (2014.01)
*H01L 21/02* (2006.01)
*H01L 33/06* (2010.01)
*H01L 33/26* (2010.01)
*H01L 33/42* (2010.01)

(52) U.S. Cl.
CPC .... *H01L 33/0093* (2020.05); *H01L 21/02354* (2013.01); *H01L 33/06* (2013.01); *H01L 33/26* (2013.01); *H01L 33/42* (2013.01); *H01L 2933/0025* (2013.01)

(58) Field of Classification Search
CPC ........... H01L 33/0093; H01L 21/02354; H01L 33/06; H01L 33/26; H01L 33/42; H01L 2933/0025
See application file for complete search history.

(56) References Cited

U.S. PATENT DOCUMENTS 9,991,122 B2 * 6/2018 Meade ............. H01L 21/02521
10,121,932 B1 11/2018 Torres, Jr.
10,381,506 B1 * 8/2019 Torres, Jr. ............... H01L 33/26
(Continued)

OTHER PUBLICATIONS

C. M. Torres Jr., et al., "High-Current Gain Two-Dimensional MoS2-Base Hot-Electron Transistors," Nano Letters, 15 (12) 7905-7912, (2015).
(Continued)

*Primary Examiner* — Yara B Green
*Assistant Examiner* — Akhee Sarker-Nag
(74) *Attorney, Agent, or Firm* — Naval Information Warfare Center, Pacific; Kyle Eppele; Euclid Woo

(57) ABSTRACT

A method removes defects in a dielectric layer, such as during fabrication of a device that emits light from hot electrons injected into an atomically two-dimensional material. An atomically two-dimensional material and the dielectric layer are adjoined. The dielectric layer is adapted to convey a variable electric field for modulating a wavelength of photons electronically emitted across a band structure of the atomically two-dimensional material. Laser pulses are strobed into the dielectric layer with sufficient cumulative energy to remove a majority of the defects in the dielectric layer without altering the atomically two-dimensional material.

23 Claims, 7 Drawing Sheets

(56) References Cited

U.S. PATENT DOCUMENTS

2009/0242843 A1* 10/2009 Ebara ............... H01L 21/76229
  423/349
2020/0020762 A1* 1/2020 Frank ................ H01L 21/0228
2021/0341387 A1* 11/2021 Smith ............... G01N 21/6402

OTHER PUBLICATIONS

Y.-W. Lan, et al., "Dual-Mode Operation of 2D Material-Base Hot Electron Transistors," Scientific Reports, 6, 32503, (2016).
C. M. Torres Jr., "Vertical Tunneling Hot Carrier Transport in 2D van der Waals Material-Based Devices for Optoelectronic Applications". UCLA. ProQuest ID: TorresJr_ucla_0031D_13666. Merritt ID: ark:/13030/m5wd67fk, (2015).
C. Zeng, et al., "Vertical Graphene-Base Hot-Electron Transistor," Nano Letters, 13, 6, 2370-2375, (2013).
A. S. Foster et al., "Vacancy and Interstitial Defects in Hafnia," Physical Review B, 65, 174117 (2002).
J. Ni et al., "Oxygen Defect Induced Photoluminescence of HfO2 Thin Films," Applied Physics Letters, 93, 011905 (2008).
K. Xiong et al., "Defect Energy Levels in HfO2 High-Dielectric Constant Gate Oxide," Applied Physics Letters, 87, 183505 (2005).
M. Kong et al., "The Optical Absorption and Photoluminescence Characteristics of Evaporated and IAD HfO2 Thin Films," Coatings, 9, 307, (2019).

* cited by examiner

LASER REMOVAL OF DEFECTS IN A DIELECTRIC FOR MODULATING AN ADJOINING ATOMICALLY TWO-DIMENSIONAL MATERIAL

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, CA, 92152; voice (619) 553-5118; ssc_pac_t2@navy.mil. Reference Navy Case Number 111857.

BACKGROUND OF THE INVENTION

Nanomaterials can be incorporated into heterostructure devices for optoelectronic applications. However, when nanomaterials are encapsulated in certain dielectrics with a high dielectric constant, defects in the encapsulating dielectric produce a broadband luminescence spectrum, which obscures the light emitted from the nanomaterial encapsulated in the dielectric. There is a general need to remove defects in the encapsulating dielectric to reduce or eliminate the broadband luminescence spectrum caused by the defects without damaging the nanomaterial encapsulated in the dielectric.

SUMMARY

A method removes defects in a dielectric layer, such as during fabrication of a device that emits light from hot electrons injected into an atomically two-dimensional material. An atomically two-dimensional material and the dielectric layer are adjoined. The dielectric layer is adapted to convey a variable electric field for modulating a wavelength of photons electronically emitted across a band structure of the atomically two-dimensional material. Laser pulses are strobed into the dielectric layer with sufficient cumulative energy to remove a majority of the defects in the dielectric layer without altering the atomically two-dimensional material.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

Figure 1A:
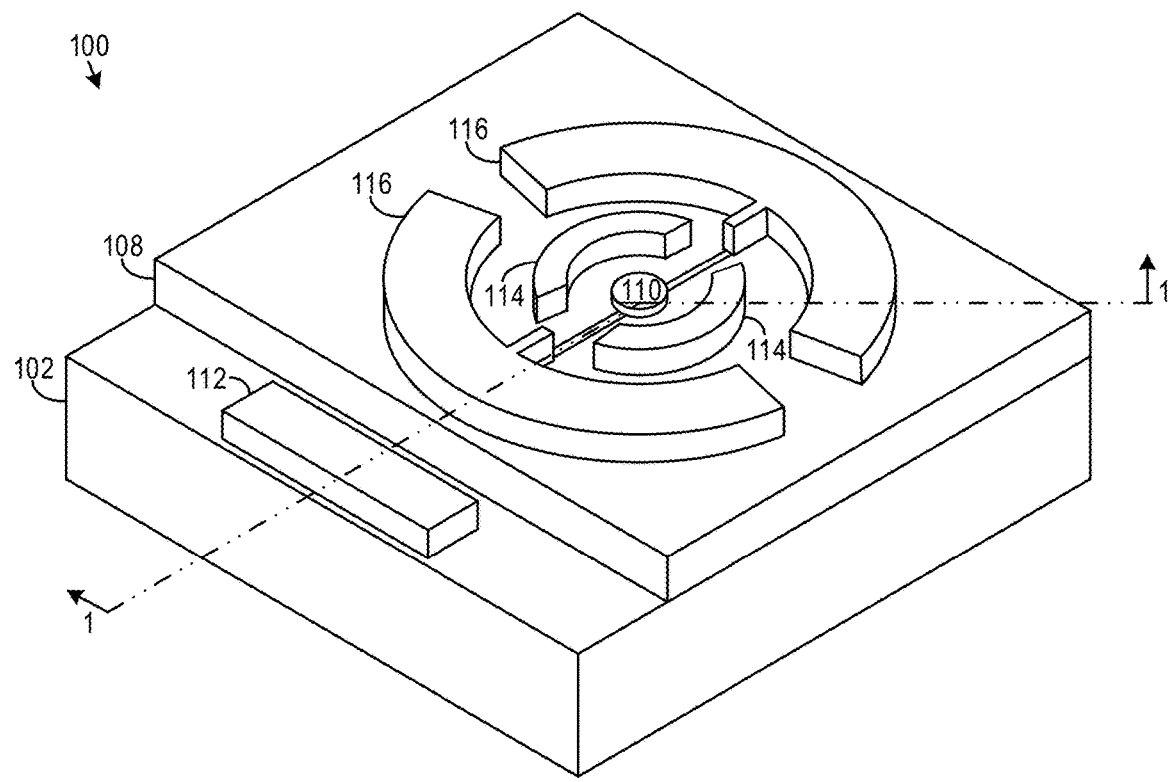
FIG. 1A is a perspective view of a device for emitting light in accordance with an embodiment of the invention.

FIG. 1A is a perspective view of a device 100 for emitting light in accordance with an embodiment of the invention. The light is either electroluminescence emitted from hot electrons, or photoluminescence emitted upon illumination with an excitation beam.

Device 100 includes a substrate 102 that is a conductive layer supplying electrons. In this embodiment, substrate 102 includes a negatively doped degenerate semiconductor. An insulating layer 104 and an atomically two-dimensional material 106 (see FIG. 1C) are sandwiched between the substrate 102 and a dielectric layer 108. A voltage bias applied between the electrode 110 and the atomically two-dimensional material 106 conveys an electric field through the dielectric layer 108 to modulate the atomically two-dimensional material 106. The dielectric layer 108 has been treated with a laser to remove defects in accordance with an embodiment of the invention.

Contact 112 biases substrate 102, contacts 114 bias the atomically two-dimensional material 106, and contacts 116 bias the electrode 110. With the appropriate voltage biases applied to contacts 112, 114, and 116, device 100 emits light originating from the atomically two-dimensional material 106 proximate electrode 110.

Figure 1D:
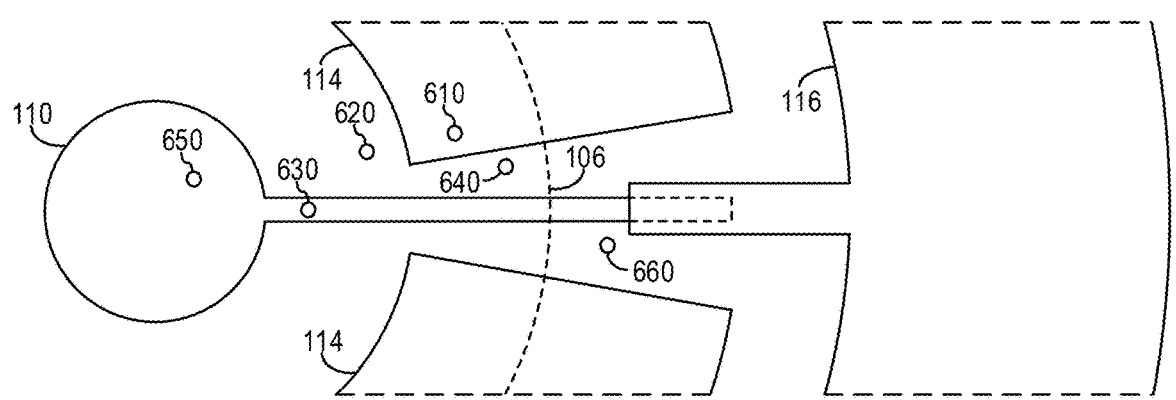
FIG. 1D is a plan view of a portion of the device of FIG. 1A showing where excitation is focused for each of the curves of FIG. 6 in accordance with an embodiment of the invention.
Figure 1B:
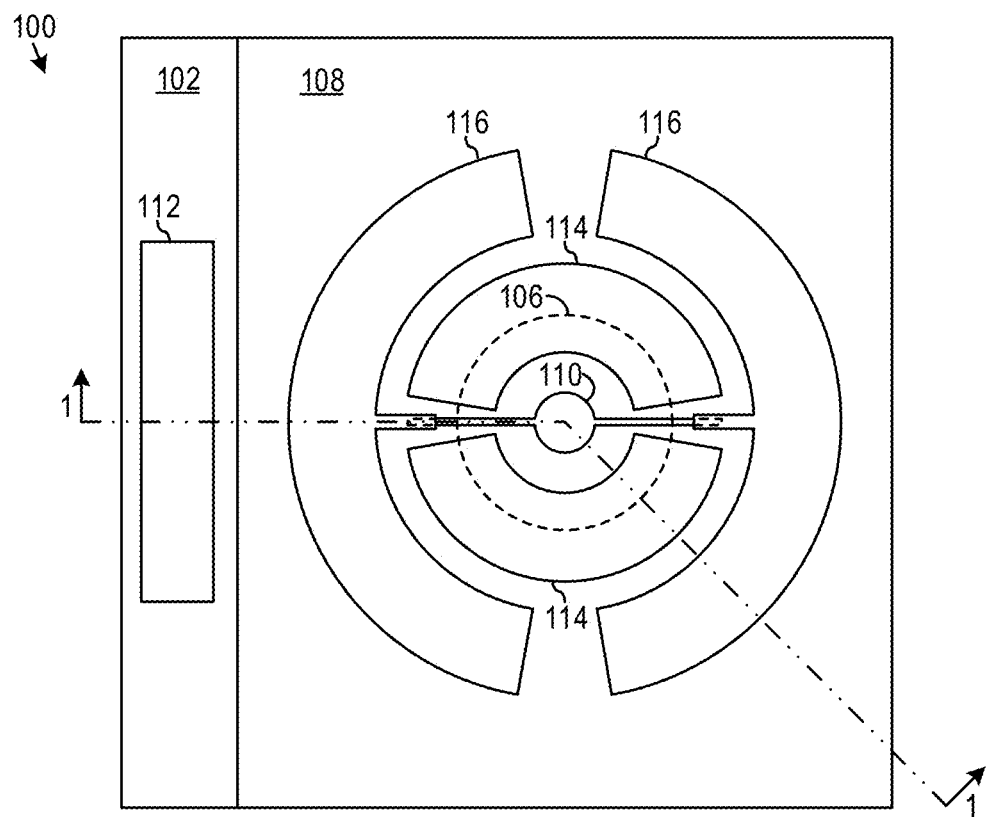
FIGS. 1B and 1C are plan and cross-sectional views of the device of FIG. 1A.
Figure 1C:
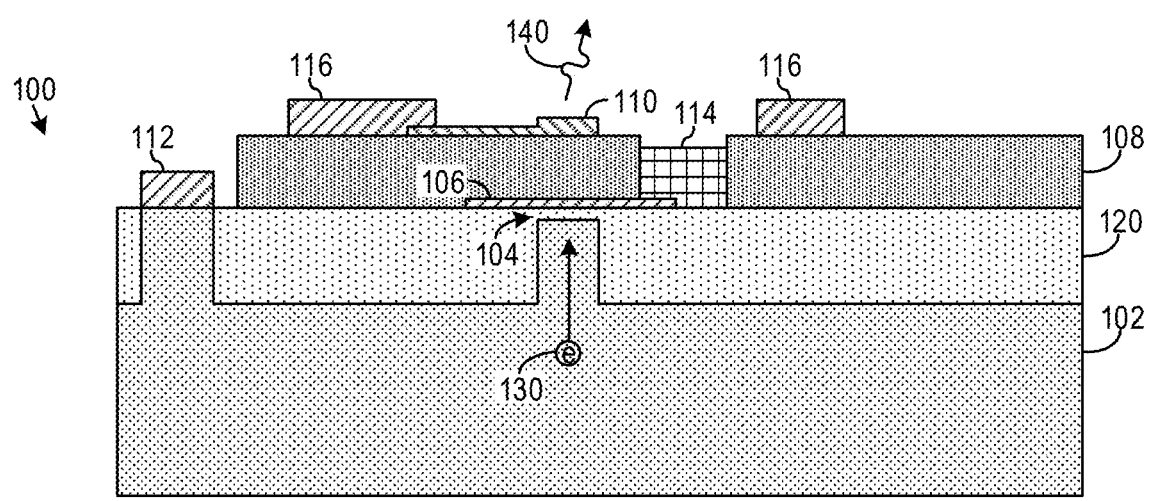

FIGS. 1B and 1C are plan and cross-sectional views of the device of FIG. 1A. FIG. 1C shows the cross-sectional view at section line 1-1 shown in FIG. 1A and FIG. 1B.

Substrate 102 includes a semiconductor into which is grown a thick field oxide 120 and the thin insulating layer 104, such as 2 to 3 nm of $SiO_2$. When contacts 112, 114, and 116 are appropriately biased, electrons with sufficient energy to quantum-mechanically tunnel through the thin insulating layer 104 become hot electrons 130 injected from the substrate 102 into the atomically two-dimensional material 106. These hot electrons 130 recombine with holes in the atomically two-dimensional material 106, and during this recombination, the hot electrons 130 emit photons of light 140.

The electrode 110 conveys a variable electric field through the dielectric layer 108 to the atomically two-dimensional material 106. This variable electric field modifies a band structure of the atomically two-dimensional material 106 and thereby modulates allowed direct transitions across the band structure for hot electrons 130 emitting the light 140 during the allowed direct transitions. This in turn modulates the wavelength of light 140 electronically emitted across the band structure of the atomically two-dimensional material 106, with the wavelength of the light 140 corresponding to an energy of the allowed direct transitions.

As defined in this disclosure, an atomically two-dimensional material 106 is a nanomaterial with a thickness of one to five molecular layers. A molecular layer is a single molecule that is limited to an atomic thickness in one dimension, but with an arbitrary extent in the other two dimensions. An example of an atomically two-dimensional material 106 is graphene, which has a thickness of one molecular layer with a thickness of one atom of carbon because graphene is a single planar layer of carbon atoms that are covalently bonded and arranged in a hexagonal lattice. There are not any dangling atomic bonds at the surfaces of a molecular layer of graphene. Another example of an atomically two-dimensional material 106 is a single molecular layer of a transition metal dichalcogenide, such as $MoS_2$, $MoSe_2$, $WS_2$, and $WSe_2$. A molecular layer of a transition metal dichalcogenide has a thickness of about three atoms (~0.65 nm thick) because the molecular layer includes a planar layer of atoms of the transition metal bonded to an offset planar layer of atoms of the chalcogenide on either side of the transition metal planar layer, with ionic bonds sloping at an angle among the three planar layers. Like graphene, there are not any dangling atomic bonds at the surfaces of the molecular layer of the transition metal dichalcogenide. Yet another example of an atomically two-dimensional material 106 is a molecular layer of a topological insulator, such as $Bi_2Se_3$, which consists of five atomic layers of bismuth and selenium.

Because the atomically two-dimensional material 106 has a thickness of one to five molecular layers as defined in this disclosure, the atomically two-dimensional material 106 includes a two-dimensional crystal that is up to five layers of graphene, which has a thickness of a single atom, such that the atomically two-dimensional material 106 of graphene has a thickness of up to five atoms of carbon. Similarly, the atomically two-dimensional material 106 includes a two-dimensional crystal that is up to five molecular layers of a transition metal dichalcogenide, with each such molecular layer having a thickness of about three atoms, such that the atomically two-dimensional material 106 of the transition metal dichalcogenide has a thickness of up to fifteen atoms. Because there are no dangling atomic bonds at the surfaces of graphene or another molecular layer within the two-dimensional crystal, the bonding between the molecular layers of the two-dimensional crystal consists essentially of van der Waals bonding. Moreover, bonding between the atomically two-dimensional material 106 and the dielectric layer 108 and between the atomically two-dimensional material 106 and the insulating layer 104 consists essentially of van der Waals bonding In practice, the number of molecular layers within the atomically two-dimensional material 106 is limited to a number of molecular layers small enough that adjacent materials can readily modify the band structure from that of the band structure in the bulk. Thus, the atomically two-dimensional material 106 is typically one to four molecular layers with bonding within the molecular layers primarily being covalent bonding or ionic bonding, and with bonding between the molecular layers consisting essentially of van der Waals bonding. When the atomically two-dimensional material 106 includes multiple molecular layers, the molecular layers are either coupled in registration with each other to form a two-dimensional crystal, or decoupled from each other to form a decoupled stack of molecular layers. Molecular layers that are coupled in registration present a single band structure modified from the band structure in the bulk. Molecular layers that are decoupled present a composite band structure that includes a series of the band structures of the individual molecular layers.

Figure 2A:
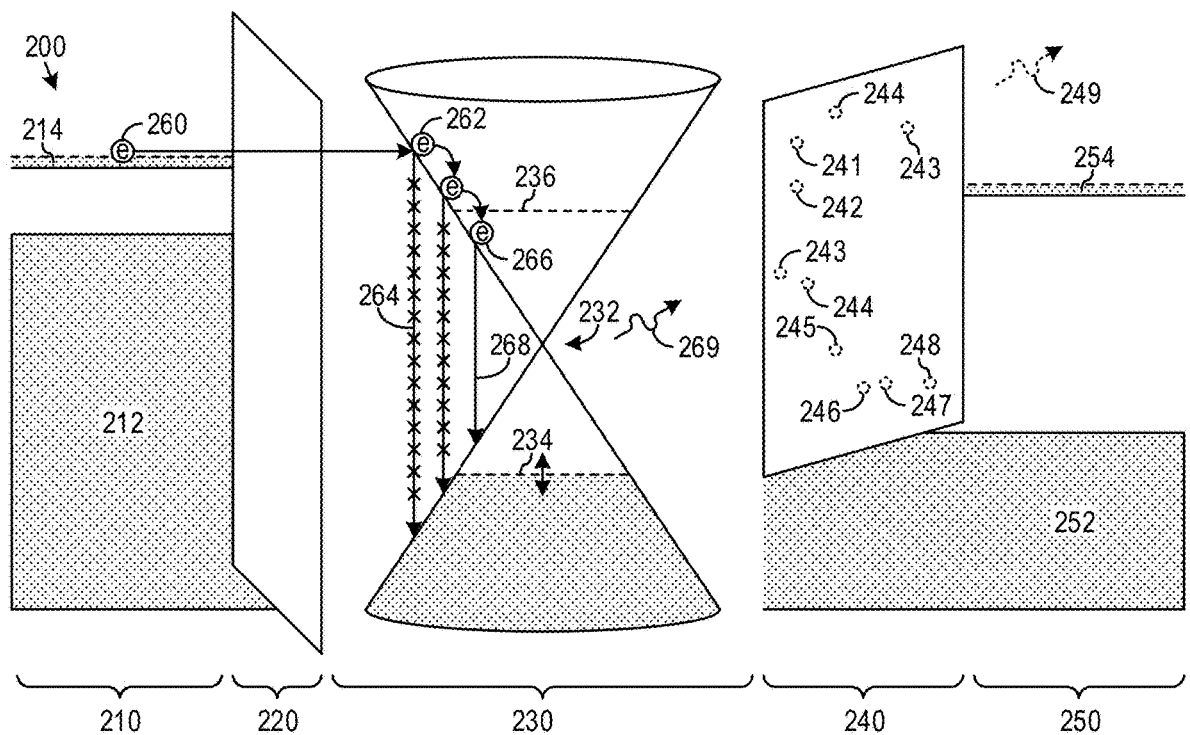
FIGS. 2A and 2B are energy band diagrams of the band structures of devices for emitting light in accordance with respective embodiments of the invention.

FIG. 2A is an energy band diagram 200 of the band structure of a device 100 of FIG. 1A-D for emitting light in accordance with an embodiment of the invention using one to five graphene molecular layers, and preferably one molecular layer or at most four molecular layers, for the atomically two-dimensional material.

From left to right, FIG. 2A shows the energy band diagram 210 of the semiconductor substrate, the energy band diagram 220 of the insulating layer, the band structure 230 of the atomically two-dimensional material composed of graphene, the energy band diagram 240 of the dielectric layer, and the energy band diagram 250 of the electrode.

The vertical dimension in FIG. 2A corresponds to an electronic energy within the energy band diagrams 210, 220, 240, and 250 and the band structure 230. For the energy band diagrams 210, 220, 240, and 250, the horizontal dimension of FIG. 2A corresponds to a depth along the vertical dimension of FIG. 1C within the semiconductor substrate 102, the insulating layer 104, the dielectric layer 108, and the electrode 110, respectively. The band structure 230 of the atomically two-dimensional material 106 is depicted in the active region of the device. The horizontal dimension of band structure 230 in FIG. 2A instead corresponds to the crystal momentum wavevector of the charge carriers in the atomically two-dimensional material 106.

The energy band diagram 210 of the semiconductor substrate 102 includes a valence band 212 and a conduction band 214. Because the semiconductor substrate 102 is a negatively doped semiconductor that is heavily doped to produce a degenerate semiconductor, the conduction band 214 includes a sufficient supply of electrons so that the semiconductor substrate 102 acts as a conductive layer. Due to this conductivity, the energy band diagram 210 does not significantly vary with depth within the semiconductor substrate 102 as shown with the constant edge of the conduction band 214 and constant edge of the valence band 212 across the horizontal dimension of FIG. 2A.

The energy band diagram 220 of the insulating layer 104 shows the bandgap of an insulator. The conduction and valence band edges of the bandgap are tilted due to voltage biasing with an electric field conveyed across the insulating layer 104. However, the insulating layer 104 is so thin that energy band diagram 220 acts as an energy barrier through which certain electrons can quantum mechanically tunnel as discussed below.

The band structure 230 of the atomically two-dimensional material 106 depicts electronic energy versus the crystal momentum wavevector (e.g. dispersion relation) located at the K point of the Brillouin zone of charge carriers within the atomically two-dimensional material 106. The band structure 230 of the atomically two-dimensional material 106 shows the Dirac band structure (e.g. dispersion relation) of graphene including two cones with the apexes of the two cones meeting at the Dirac point 232 in the center of the band structure 230.

The energy band diagram 240 of the dielectric layer 108 shows midgap states corresponding to defect states within the bandgap of an insulator. The conduction and valence band edges of the bandgap are tilted due to an electric field conveyed across the dielectric layer 108. The dielectric layer 108 is transparent to visible and/or near infrared light generated in the atomically two-dimensional material 106, such as photons 269.

The bandgap of the energy band diagram 240 includes the example energy states 241, 242, 243, 244, 245, 246, 247, and 248 of example defects within the dielectric layer 108, which example defects and their corresponding energy states are removed with laser treatment in accordance with an embodiment of the invention as indicated by the dotted lines for energy states 241, 242, 243, 244, 245, 246, 247, and 248.

The example energy states 241, 242, 243, 244, 245, 246, 247, and 248 of the defects are located within the dielectric layer 108, with the vertical dimension corresponding to the electronic energy of the defect state relative to the conduction and valence band edges vertically above and below each energy state.

The example energy state 241 corresponds to a negatively charged oxygen vacancy where an oxygen atom is missing from the dielectric layer 108 that is $HfO_2$. The example energy state 242 corresponds to a neutral oxygen vacancy. The two energy states 243 correspond to a positively charged oxygen vacancy. The two energy states 244 correspond to a twice positively charged oxygen vacancy. The example energy state 245 corresponds to a neutral oxygen interstitial where an extra oxygen atom is inserted into the dielectric layer 108 of $HfO_2$. The example energy state 246 corresponds to a negatively charged oxygen interstitial. The example energy state 247 corresponds to a neutral $O_2$ interstitial. The example energy state 248 corresponds to a negatively charged $O_2$ interstitial. Embodiments of the invention include laser treatment that removes defects and their corresponding energy states by, for example, combining the oxygen vacancy defects of the example energy states 241, 242, 243, and 244 with the oxygen interstitial defects of the example energy states 245, 246, 247, and 248 in the dielectric layer 108 of $HfO_2$.

The energy band diagram 250 of the electrode 110 includes a valence band 252 and a conduction band 254 because in this embodiment, the electrode 110 is Indium doped Tin Oxide (ITO), which the Indium negatively dopes to produce a degenerate semiconductor. Thus, the conduction band 254 includes a sufficient density of electrons so that the electrode 110 acts as a conductor. In one example, the ITO electrode 110 is 45 nm thick. The wide bandgap makes the ITO electrode 110 transparent to visible and near infrared light generated in the atomically two-dimensional material 106, such as photons 269. It will be appreciated that the electrode 110 is graphene in another embodiment.

During operation of the device 100 with energy band diagram 200, a voltage bias between the semiconductor substrate 102 and the atomically two-dimensional material 106 gives electrons 260 in the conduction band 214 sufficient electronic energy so that hot electrons 262 out of electrons 260 quantum mechanically tunnel from the conductive layer of semiconductor substrate 102 through the thin barrier of insulating layer 104 into the atomically two-dimensional material 106. Because the electrons 260 have a distribution of energies above and close to the edge of the conduction band 214 of the energy band diagram 210, the hot electrons 262 carry a current with a distribution of energies.

Initially, the hot electrons 262 cannot directly transition to a lower energy because the target energy state is already filled, as indicated by the shading extending up to the Fermi level 234 within the band structure 230. Thus, the initial direct transition 264 is forbidden. Although an indirect transition to a lower energy is possible, conservation of momentum requires an interaction with a phonon, for example, and this make the likelihood of such an indirect transition negligible. Because the hot electrons 262 cannot directly transition to a lower energy, the hot electrons 262 undergo scattering events that incrementally reduce the energy of the hot electrons 262 until the hot electrons 262 become hot electrons 266.

Hot electrons 266 have an allowed direct transition 268 to a lower energy because the target energy state is above the Fermi level 234 and hence is empty. Hot electrons 266 have a non-negligible probability of making the direct transition 268 and recombining with holes at the target energy state because direct transition 268 conserves momentum, and because direct transition 268 releases photons 269 to conserve energy. In summary, hot electrons 262 undergo scattering events that incrementally lower energy until the hot electrons 262 become hot electrons 266 having an energy below the mirror image 236 of the Fermi level 234, and then the hot electrons 266 recombine with holes in the allowed direct transition 268 that releases photons 269.

With a sufficient density of the defects in the dielectric layer 108, the photons 249 emitted from transitions via the example energy states 241, 242, 243, 244, 245, 246, 247, and 248 during diagnostic photoluminescence measurements (e.g. optical excitation of defects) can overwhelm the intensity of the desired photons 269. Therefore, embodiments of the invention include laser treatment to remove the defects and their example energy states 241, 242, 243, 244, 245, 246, 247, and 248, and thereby increase the signal-to-noise ratio (SNR) of the tunable device 100.

A voltage bias between the electrode 110 and the atomically two-dimensional material 106 generates an electric field through the dielectric layer 108. As the negative voltage bias between the electrode 110 and the atomically two-dimensional material 106 increases, the Fermi level in the conduction band 254 of the electrode 110 increases and the Fermi level 234 in the graphene decreases. This is the electric field effect on the band structure 230. Thus, a variable voltage bias between the electrode 110 and the atomically two-dimensional material 106 conveys a variable electric field through the dielectric layer 108 that modulates the Fermi level 234 in the graphene of the atomically two-dimensional material 106. The dielectric layer 108 preferably has a high dielectric constant to convey the variable electric field efficiently and is transparent to photons 269. For example, the dielectric layer 108 is a metal oxide such as $HfO_2$ and $Al_2O_3$.

When the negative voltage bias between the electrode 110 and the atomically two-dimensional material 106 increases, the Fermi level 234 drops and its mirror image 236 rises. With a sufficiently strong negative voltage bias, the mirror image 236 of Fermi level 234 increases above the initial energy of hot electrons 262. This changes the formerly forbidden transition 264 into an allowed transition that releases higher energy photons (not shown) with a shorter wavelength than the former photons 269. Thus, a variable voltage bias between the electrode 110 and the atomically two-dimensional material 106 modulates a Fermi level 234 in the graphene and thereby modulates the allowed direct transitions into holes at or above the Fermi level 234 for hot electrons 262 or 266 emitting the photons, such as photons 269, during the allowed direct transitions within the graphene.

In summary, the hot electrons 262 are injected into the atomically two-dimensional material 106. The hot electrons 262 transition across the band structure 230 and emit photons 269 within the atomically two-dimensional material 106.

Figure 2B:
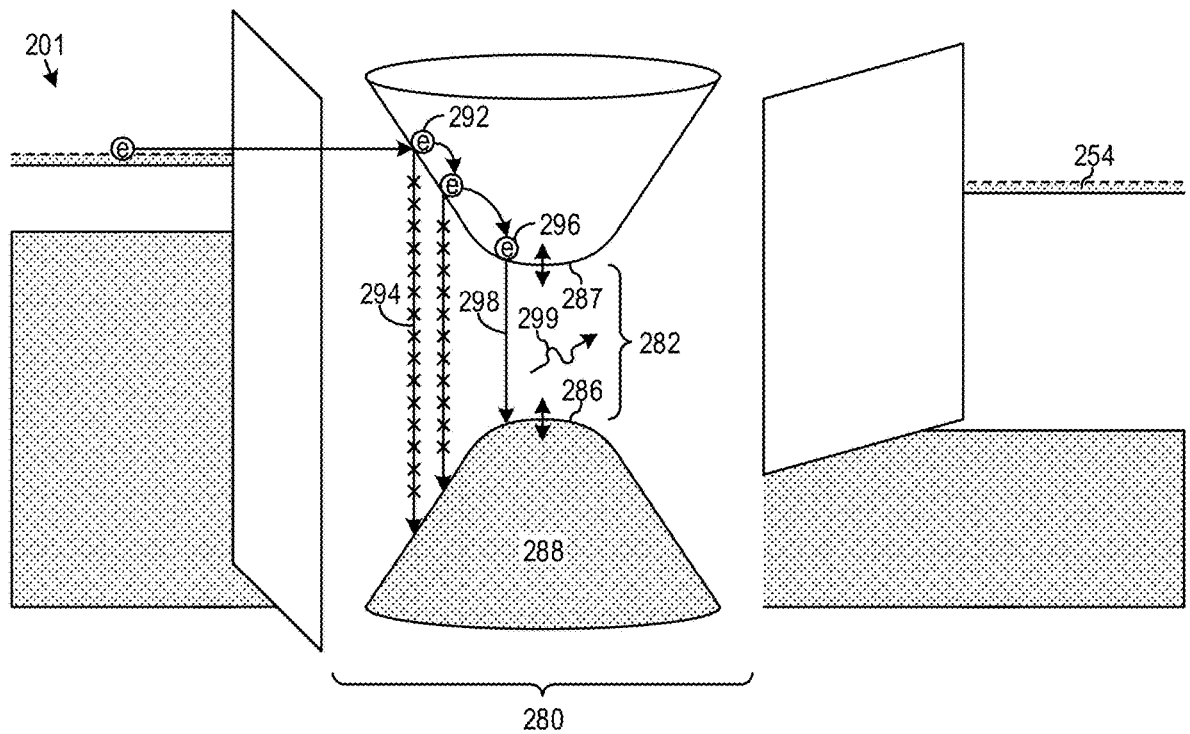

FIG. 2B is an energy band diagram 201 of the band structure of a device 100 of FIG. 1A-D for emitting light in accordance with an embodiment of the invention using one to four molecular layers of a transition metal dichalcogenide for the atomically two-dimensional material 106. FIG. 2B is similar to FIG. 2A except for the band structure 280 of the transition metal dichalcogenide and the omitted energy states of the defects already removed from the dielectric layer 108 in accordance with an embodiment of the invention.

The transition metal dichalcogenide of FIG. 2B has a different band structure 280 compared to the band structure 230 of graphene of FIG. 2A; the band structure 280 has a direct bandgap 282 instead of the Dirac point 232 of band structure 230.

A voltage bias between the electrode 110 and the atomically two-dimensional material 106 creates an electric field vertical to the plane of the atomically two-dimensional material 106. As the voltage bias between the electrode 110 and the atomically two-dimensional material 106 increases, the Stark effect decreases the direct bandgap 282. Thus, a variable voltage bias between the electrode 110 and the atomically two-dimensional material 106 conveys a variable electric field across dielectric layer 108 for modulating the direct bandgap 282 via the Stark effect.

Initially, the hot electrons 292 cannot directly transition to a lower energy because the target energy state is already filled, so the initial direct transition 294 is forbidden. Because the hot electrons 292 cannot directly transition to a lower energy, the hot electrons 292 undergo scattering events that incrementally reduce the energy of the hot electrons 292 until the hot electrons 292 become hot electrons 296. Hot electrons 296 have an allowed direct transition 298 to a lower energy. Thus, hot electrons 292 undergo scattering events that incrementally lower energy until the hot electrons 292 reaches the conduction band edge 287, and then the hot electrons 296 recombine with holes in the allowed direct transition 298 to the valance band edge 286, releasing photons 299.

When the negative voltage bias between the electrode 110 and the atomically two-dimensional material 106 increases, the direct bandgap 282 decreases. With a sufficiently strong negative voltage bias, the bandgap 282 decreases and as hot electrons 292 are injected into the atomically two-dimensional material 106, the resulting hot electrons 296 emit photons 299 due to radiative recombination at longer wavelengths. Thus, a variable voltage bias between the electrode 110 and the atomically two-dimensional material 106 modulates the direct bandgap 282 via the Stark effect, and thereby modulates the allowed direct transition 298 across the direct bandgap 282 for hot electrons 296 emitting photons 299 during the allowed direct transition 298 within the transition metal dichalcogenide.

Figure 3:
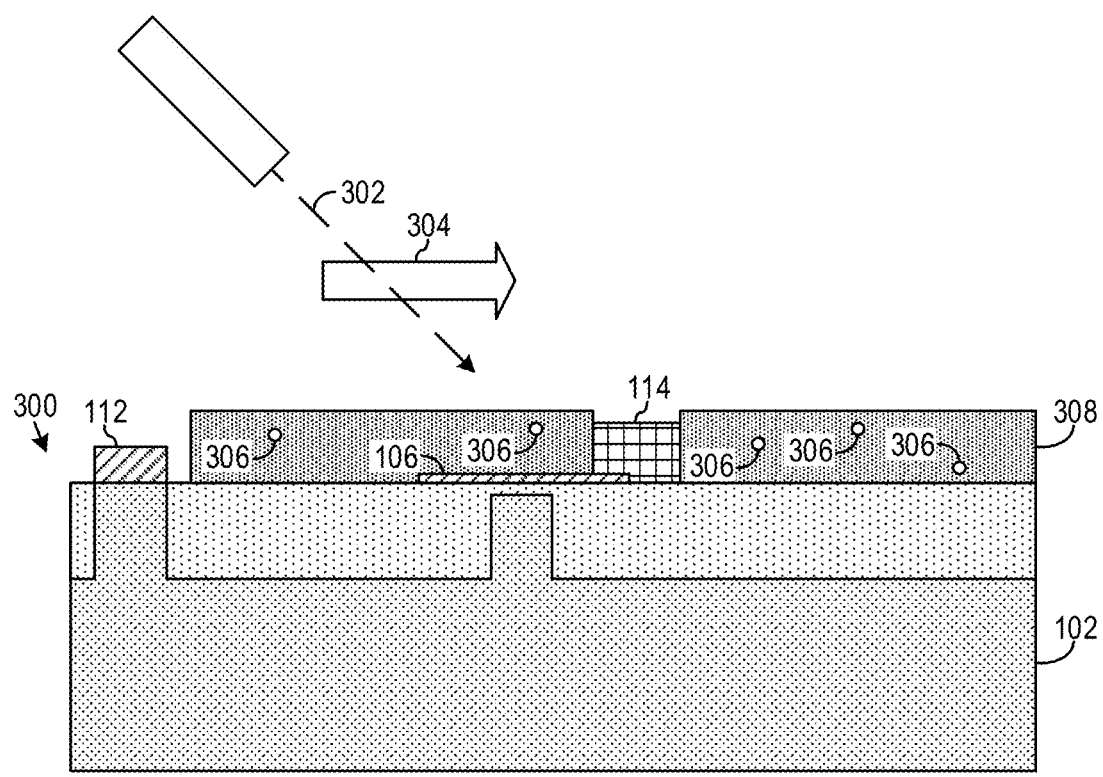
FIG. 3 is cross-sectional view showing strobing of the laser pulses through an atmosphere to remove defects in a dielectric layer during fabrication of the device of FIG. 1A-D in accordance with an embodiment of the invention.

FIG. 3 is cross-sectional view showing strobing of the laser pulses 302 through an atmosphere 304 to remove defects 306 in a dielectric layer 308 during fabrication of the device 100 of FIG. 1A-D in accordance with an embodiment of the invention. Further details of device fabrication and device operation as shown in FIG. 2A and FIG. 2B are disclosed in U.S. Pat. Nos. 10,121,932 and 10,381,506, which are incorporated by reference. The device 300 of FIG. 3 corresponds to the device 100 of FIG. 1C, but before the removal of defects 306 and before deposition and patterning of electrode 110 and contacts 116.

It will be appreciated that laser treatment in accordance with embodiments of the invention can occur at any intermediate step in the fabrication of device 100 after formation of dielectric layer 308, such as after adjoining the atomically two-dimensional material 106 and the dielectric layer 308, but before deposition and patterning of contacts 112 and 114. It will be appreciated that the laser treatment uses a continuous-wave laser instead of laser pulses 302 in another embodiment.

In one embodiment, the dielectric layer 308 is deposited onto the atomically two-dimensional material 106, and the defects 306 are introduced into the dielectric layer 308 during the deposition. For example, the dielectric layer 308 is formed with repeated atomic layer deposition of a metal oxide, such as 55 nm of $HfO_2$, onto the atomically two-dimensional material 106 held at a temperature of 200° C. This atomic layer deposition produces the dielectric layer 308 that is an amorphous stack of atomic layers of the metal oxide, which includes the defects 306 typically as oxygen vacancies and oxygen interstitials between the atomic layers of the metal oxide.

The laser pulses 302 are strobed into the dielectric layer 308 with sufficient cumulative energy to remove a majority of the defects 306 in the dielectric layer 308 without altering the atomically two-dimensional material 106, thereby forming the dielectric layer 108 of FIG. 1A-D. For one example, the dielectric layer 308 is composed of a metal oxide incorporating the defects 306, which include oxygen vacancies and oxygen interstitials, and the laser pulses 302 combine certain of the oxygen vacancies and certain of the oxygen interstitials, thereby removing these defects 306 from the metal oxide of the dielectric layer 308. In another example, the laser pulses 302 are strobed into the dielectric layer 308 through an atmosphere 304 including oxygen and then into the metal oxide of the dielectric layer 308. This adds oxygen to the dielectric layer 308 for removing oxygen vacancies from the dielectric layer 308. In yet another example, the laser pulses 302 are strobed into the dielectric layer 308 through an atmosphere 304 not including any oxygen, such as a vacuum or a flowing inert gas, and then into the metal oxide of the dielectric layer 308. This removes oxygen from the dielectric layer 308 for removing oxygen interstitials from the dielectric layer 308.

It will be appreciated that laser treatment includes alternating between an atmosphere 304 including oxygen and an atmosphere 304 not including any oxygen to remove both oxygen vacancies and oxygen interstitials from the dielectric layer 308. It will be appreciated that when the dielectric layer 308 is formed with repeated atomic layer deposition, the formation of the dielectric layer 308 includes alternating between depositing a portion of the atomic layers of the dielectric layer 308 and strobing with laser pulses 302 to remove defects in those previously deposited atomic layers of the dielectric layer 308, without altering the atomically two-dimensional material 106.

A wavelength of the laser pulses 302 is selected to match an absorption spectrum of dielectric layer 308 and its defects 306. To prevent damage to the underlying atomically two-dimensional material 106, either the wavelength of the laser pulses 302 is selected so that the skin depth for the dielectric layer 308 at the selected wavelength matches the thickness of the dielectric layer 308 so that the laser pulses 302 do not appreciably reach the underlying atomically two-dimensional material 106, or the wavelength of the laser pulses 302 is selected so that the laser pulses 302 reaching the underlying atomically two-dimensional material 106 do not damage the underlying atomically two-dimensional material 106. For example, the wavelength of the laser pulses 302 is selected as 193 nm from an ArF excimer laser that uniformly illuminates the entire region containing the dielectric layer 308 with a cumulative energy of 4 $mJ/cm^2$ delivered at a pulse rate not causing any ablation. The laser treatment is fast, reliable, robust, and non-destructive. The progress of laser treatment is monitored in real time in one embodiment with laser probing using the treatment laser pulses 302 or another laser having a different wavelength.

Figure 4:
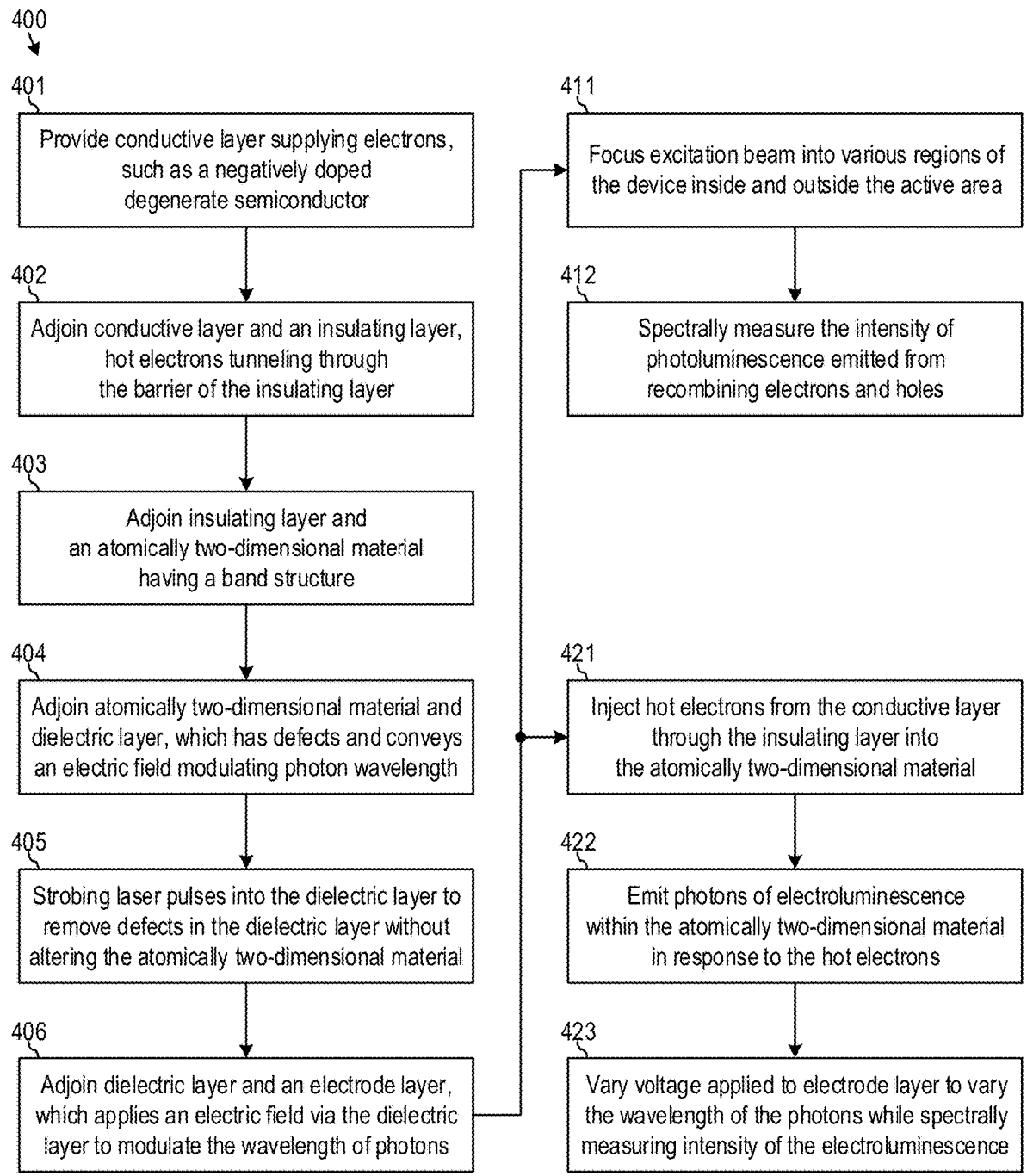
FIG. 4 is a flow diagram of a method for removing defects in a dielectric layer of a device for emitting light in accordance with an embodiment of the invention.

FIG. 4 is a flow diagram of a method 400 for removing defects in a dielectric layer of a device for emitting light in accordance with an embodiment of the invention. Steps 401 through 406 fabricate the device emitting light from hot electrons. Steps 411 and 412 test and characterize the fabricated device, but in another embodiment that monitors laser treatment in real time, method 400 is modified to include a repeated cycle around step 404, which deposits a portion of the dielectric layer, step 405, step 411, and step 412 before completing fabrication at step 406. Steps 421 through 423 operate the fabricated device to emit light.

At step 401, a conductive layer is provided that is a supply of electrons. For example, the conductive layer is a negatively doped degenerate semiconductor. At step 402, the conductive layer and an insulating layer are adjoined. For example, a thin oxide layer is grown on or into the conductive layer. The insulating layer providing a thin barrier that allows hot electrons to quantum mechanically tunnel through the thin barrier from the conductive layer to an atomically two-dimensional material.

At step 403, the insulating layer and the atomically two-dimensional material are adjoined. For example, the atomically two-dimensional material is floated on a liquid and a substrate with the conductive layer and the insulating layer is raised under the atomically two-dimensional material, and then the liquid is drained and dried away. The atomically two-dimensional material has a band structure for emitting light.

At step 404, the atomically two-dimensional material and a dielectric layer are adjoined. For example, the dielectric layer is formed with repeated atomic layer deposition onto the atomically two-dimensional material. The dielectric layer has defects and is adapted to convey a variable electric field for modulating a wavelength of photons electronically emitted across the band structure of the atomically two-dimensional material.

At step 405, laser pulses are strobed into the dielectric layer with sufficient cumulative energy to remove a majority of the defects in the dielectric layer without altering the atomically two-dimensional material. For example, the dielectric layer is composed of a $HfO_2$ incorporating the defects, which include oxygen vacancies and oxygen interstitials, and the laser pulses combine certain of the oxygen vacancies and certain of the oxygen interstitials, thereby removing these defects from the $HfO_2$ of the dielectric layer.

At step 406, the dielectric layer and an electrode layer are adjoined. The electrode layer is adapted to apply a variable electric field via the dielectric layer to modulate the wavelength of the photons emitted when the hot electrons transition across the band structure of the atomically two-dimensional material. For example, the variable electric field modulates the band structure of the atomically two-dimensional material and thereby modulates allowed direct transitions across the band structure for the hot electrons emitting photons during the allowed direct transitions, with the wavelength of the photons corresponding to an energy of the allowed direct transitions.

Steps 411 and 412 test and characterize the device fabricated in steps 401 through 406. At step 411, an excitation beam is focused into an illumination spot in various regions of the device inside and outside the active area. The optical excitation locally generates electron/hole pairs at the illumination spot, which leads to photoluminescence. This photoluminescence helps reveal the defect quality of the heterostructure region at the illumination spot. At step 412, the intensity is spectrally measured for photons emitted from the optically excited regions. The laser treatment to remove defects at step 405 is expected to reduce the defect luminescence from the defects in the dielectric layer, such that the photoluminescence measured at step 412 is predominately the desired luminescence from the atomically two-dimensional material.

Figure 5:
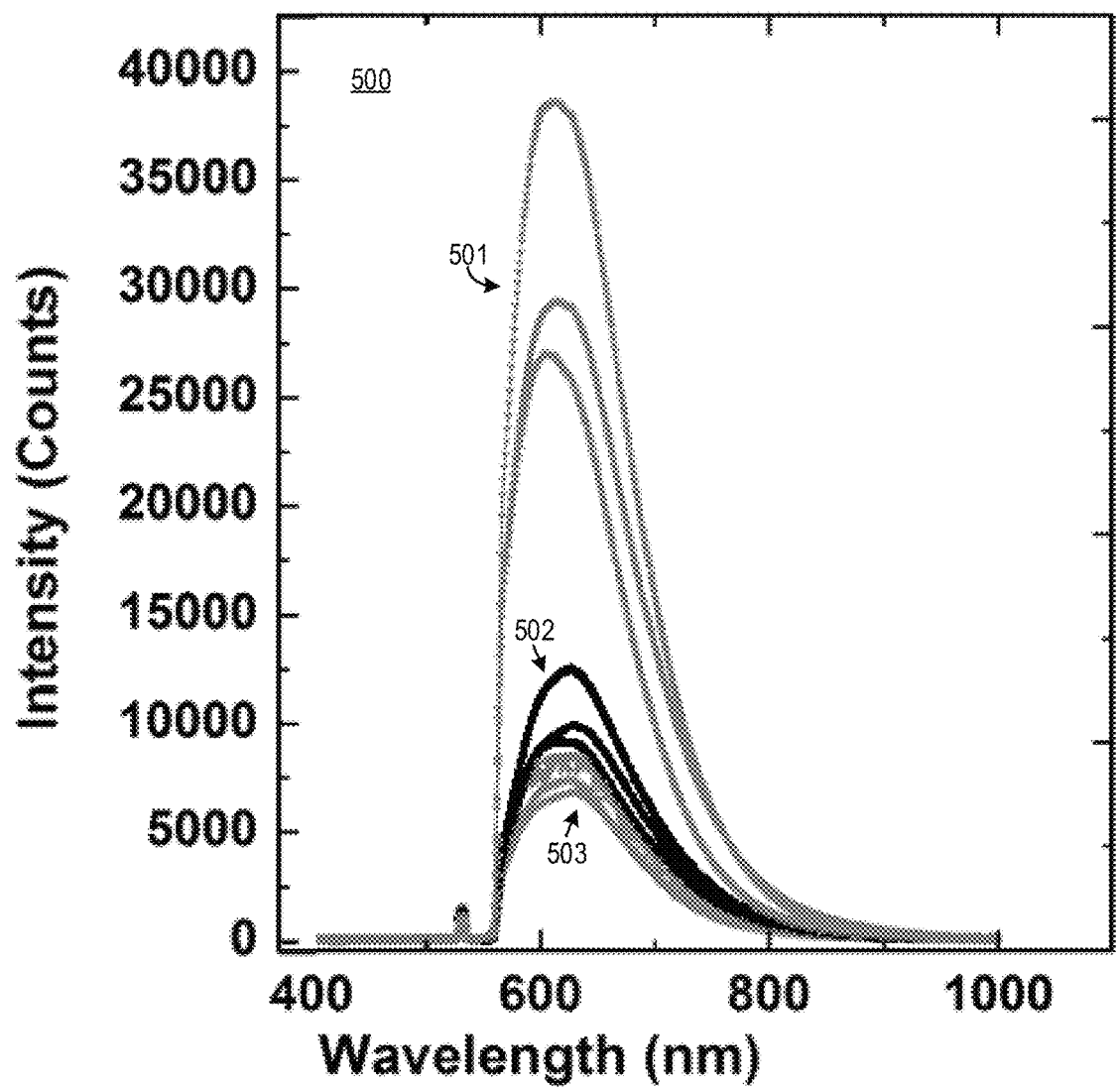
FIG. 5 is a spectral graph of intensity versus wavelength when a device for emitting light is entirely illuminated with excitation in accordance with an embodiment of the invention.

FIG. 5 is a spectral graph 500 of intensity versus wavelength when a device for emitting light is instead entirely illuminated with 532 nm excitation in accordance with an embodiment of the invention before laser treatment to remove defects in the dielectric layer. The top three curves 501 specify the photoluminescence versus wavelength for respective devices using ~20 nm (four molecular layers) of the topological insulator $Bi_2Se_3$ for the atomically two-dimensional material 106 and using graphene for the electrode 110. The middle three curves 502 specify the photoluminescence versus wavelength for respective devices using ~0.3 nm (one molecular layer) of graphene for the atomically two-dimensional material 106 and using graphene for the electrode 110, too. The bottom three curves 503 specify the photoluminescence versus wavelength for respective devices using ~0.65 nm (one molecular layer) of the transition metal dichalcogenide $MoS_2$ for the atomically two-dimensional material 106 and ITO for the electrode 110. FIG. 5 shows broadband photoluminescence in which the contribution of the light emission across the band structure of the atomically two-dimensional material is hidden within the broadband photoluminescence. The shape of the broadband photoluminescence suggests a combination of broadband contact fluorescence and electronic transitions via the not yet removed defects in the dielectric layer (e.g. defect luminescence).

Figure 6:
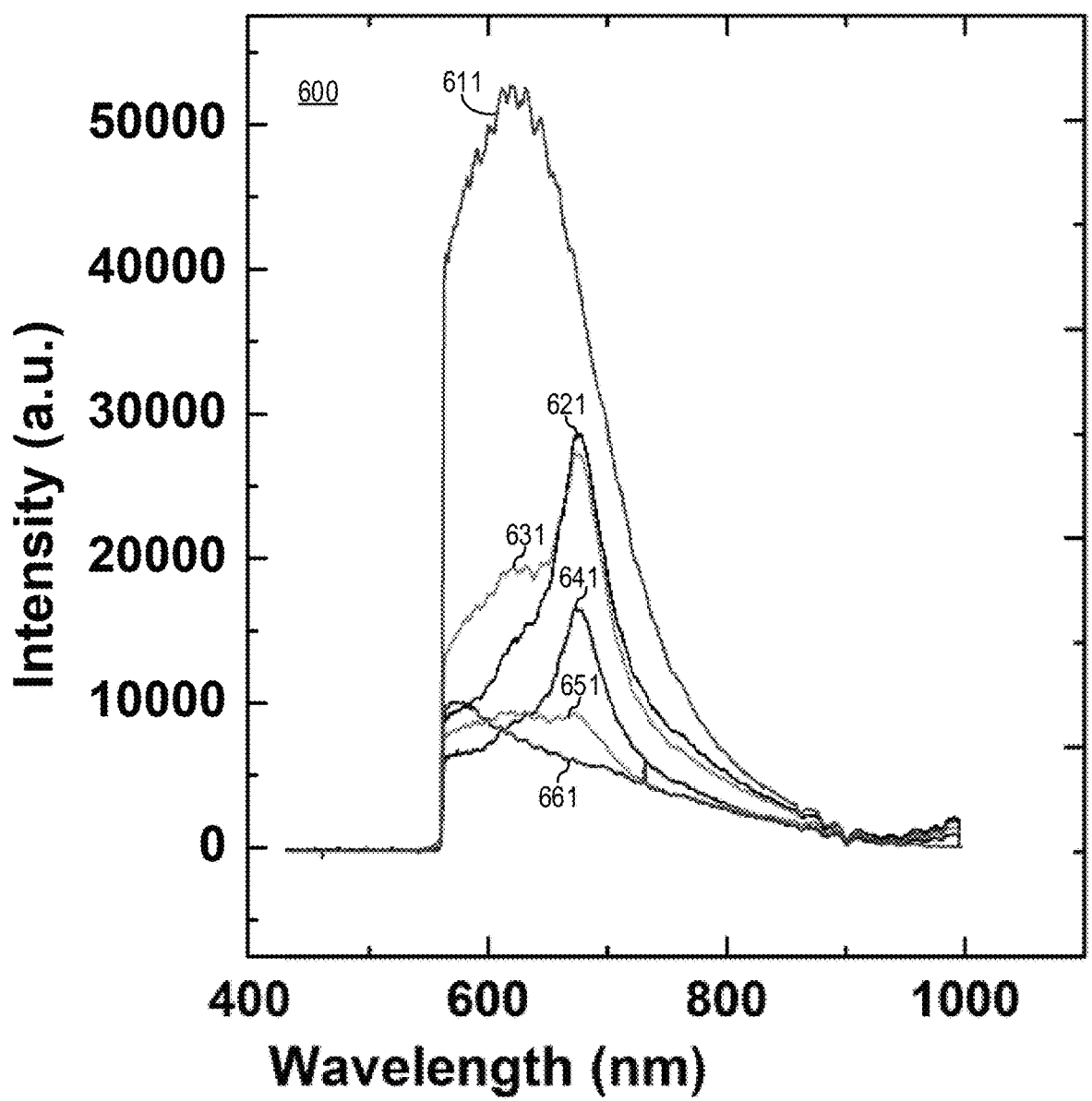
FIG. 6 is a spectral graph of intensity versus wavelength when a device for emitting light is illuminated with focused excitation in accordance with an embodiment of the invention.

FIG. 6 is a spectral graph 600 of intensity versus wavelength when a device for emitting light is illuminated with focused excitation in accordance with an embodiment of the invention before laser treatment to remove defects in the dielectric layer. FIG. 1D is a plan view of a portion of the device of FIG. 1A showing where excitation is focused for each of the curves of FIG. 6 in accordance with an embodiment of the invention.

When the laser excitation of 516 nm is focused at an approximately 5 μm diameter illumination spot 610 on contact 114 in FIG. 1D, curve 611 of FIG. 6 shows the measured photoluminescence after passing through a long-pass filter at 535 nm for removing reflected laser excitation. Curve 611 suggests that broadband contact fluorescence significantly contributes to the broadband photoluminescence when the entire device is illuminated with excitation as shown in FIG. 5.

When the laser excitation is focused on illumination spot 620 within the active region of the atomically two-dimensional material 106 in FIG. 1D, curve 621 of FIG. 6 shows the measured photoluminescence. Curve 621 shows a narrow peak at 689 nm for the desired photoluminescence from the atomically two-dimensional material 106, without being overwhelmed by defect luminescence from defects in the dielectric layer. When the laser excitation is focused on illumination spot 630 on the long thin bar connecting the electrode 110 and the contact 116 in FIG. 1D, curve 631 of FIG. 6 shows the measured photoluminescence. Curve 631 shows a narrow peak at 689 nm for the desired photoluminescence from the atomically two-dimensional material 106 plus some apparent contact fluorescence and/or defect luminescence. When the laser excitation is focused on illumination spot 640 within the active region of the atomically two-dimensional material 106 in FIG. 1D, curve 641 of FIG. 6 shows the measured photoluminescence. Again, curve 641 shows a narrow peak at 689 nm for the desired photoluminescence from the atomically two-dimensional material 106, but with reduced intensity relative to curves 621 and 631 likely due to regional differences in photoactivity.

When the laser excitation is focused on illumination spot 650 at the electrode 110 in FIG. 1D, curve 651 of FIG. 6 shows the measured photoluminescence. Although illumination spot 650 is within the active region of the atomically two-dimensional material 106 in FIG. 1D, curve 651 suggests that the electrode 110, which is thicker than the long thin bar at illumination spot 630, is opaque to the laser excitation at 516 nm, such that the measured photoluminescence is fluorescence from electrode 110.

When the laser excitation is focused on illumination spot 660 outside the active region of the atomically two-dimensional material 106 in FIG. 1D, curve 661 of FIG. 6 shows the measured photoluminescence without any narrow peak at 689 nm as expected.

Returning to FIG. 4, steps 421 through 423 operate the fabricated device to emit light. At step 421, hot electrons are injected from the conductive layer through the insulating layer into the atomically two-dimensional material. At step 422, the hot electrons transition across the band structure of the atomically two-dimensional material to emit photons of electroluminescence within the atomically two-dimensional material. At step 423, the voltage applied to the electrode is varied to vary the wavelength of the photons of electroluminescence while spectrally measuring the intensity of the electroluminescence.

From the above description of Laser Removal of Defects in a Dielectric for Modulating an Adjoining Atomically Two-Dimensional Material, it is manifest that various techniques may be used for implementing the concepts of device 100 and method 400 without departing from the scope of the claims. The described embodiments are to be considered in all respects as illustrative and not restrictive. The method/device disclosed herein may be practiced in the absence of any element that is not specifically claimed and/or disclosed herein. It should also be understood that device 100 and method 400 are not limited to the particular embodiments described herein, but are capable of many embodiments without departing from the scope of the claims.

We claim:

1. A method for removing a plurality of defects in a dielectric layer, the method comprising:
   adjoining an atomically two-dimensional material to a first side of the dielectric layer having the defects, wherein the dielectric layer is adapted to convey a variable electric field for modulating a wavelength of photons electronically emitted across a band structure of the atomically two-dimensional material; and
   strobing a plurality of laser pulses into a second side opposite the first side of the dielectric layer with sufficient cumulative energy to remove a majority of the defects in the dielectric layer without altering the atomically two-dimensional material, where the dielectric layer is not a two-dimensional material, where the defects consist of oxygen vacancies or oxygen interstitials, and where the dielectric layer is amorphous.

2. The method of claim 1, further comprising:
   applying the variable electric field conveyed through the dielectric layer for modulating the band structure of the atomically two dimensional material;
   injecting a plurality of hot electrons into the atomically two dimensional material; and
   emitting the photons within the atomically two dimensional material in response to the hot electrons transitioning across the band structure modified by the variable electric field, wherein the variable electric field modulates the wavelength of the photons because the variable electric field modulates the band structure of the atomically two dimensional material.

3. The method of claim 1, further comprising:
   illuminating the atomically two-dimensional material and the dielectric layer with an excitation beam after the adjoining and the strobing, wherein the excitation beam illuminates an entirety of the atomically two-dimensional material or a focused region of the atomically two-dimensional material; and
   measuring an intensity of a photoluminescence excited by the excitation beam, wherein the photoluminescence includes a defect luminescence from the defects in the dielectric layer and a desired luminescence emitted from the atomically two dimensional material, and because the strobing removes the majority of the defects, the defect luminescence from the dielectric layer is less than the desired luminescence from the atomically two dimensional material.

4. The method of claim 1, wherein the adjoining includes adjoining to convey the variable electric field that modulates the band structure of the atomically two dimensional material and thereby modulates allowed direct transitions across the band structure for hot electrons emitting the photons during the allowed direct transitions, with the wavelength of the photons corresponding to an energy of the allowed direct transitions.

5. The method of claim 4, wherein the atomically two dimensional material is graphene or a transition metal dichalcogenide.

6. The method of claim 1, wherein the dielectric layer is composed of a metal oxide incorporating the defects, which include oxygen vacancies and oxygen interstitials, and wherein the strobing combines certain of the oxygen vacancies and certain of the oxygen interstitials, thereby removing the certain of the oxygen vacancies and the certain of the oxygen interstitials from the metal oxide of the dielectric layer.

7. The method of claim 6, wherein the strobing of the laser pulses into the dielectric layer includes the strobing of the laser pulses through an atmosphere including oxygen and then into the metal oxide of the dielectric layer.

8. The method of claim 6, wherein the strobing of the laser pulses into the dielectric layer includes the strobing of the laser pulses through an atmosphere not including any oxygen and then into the metal oxide of the dielectric layer.

9. The method of claim 6, wherein the metal oxide of the dielectric layer is selected from the group consisting of $HfO_2$ and $Al_2O_3$.

10. The method of claim 9, wherein the atomically two dimensional material is graphene or a transition metal dichalcogenide.

11. The method of claim 1, wherein the adjoining the atomically two-dimensional material and the dielectric layer includes adjoining such that bonding between the atomically two dimensional material and the dielectric layer consists essentially of van der Waals bonding.

12. The method of claim 1, wherein the adjoining includes adjoining a first surface of the atomically two-dimensional material and the dielectric layer, the atomically two dimensional material also having a second surface opposite the first surface, and wherein the atomically two dimensional material does not have any dangling atomic bonds at the first and second surfaces.

13. The method of claim 12, wherein the atomically two dimensional material is a two dimensional crystal having one to five molecular layers, with bonding within the molecular layers primarily being covalent bonding or ionic bonding, and with bonding between the molecular layers consisting essentially of van der Waals bonding.

14. The method of claim 1, wherein the adjoining includes depositing the dielectric layer onto the atomically two-dimensional material, wherein the defects are introduced into the dielectric layer during the depositing.

15. The method of claim 14, wherein the depositing the dielectric layer includes repeated atomic layer deposition of a metal oxide onto the atomically two dimensional material, resulting in the dielectric layer that is amorphous and includes the defects within the metal oxide.

16. The method of claim 1, wherein the adjoining includes adjoining the atomically two dimensional material, which is graphene, and the dielectric layer, which is adapted to convey the variable electric field for modulating a Fermi level in the graphene and thereby modulating allowed direct transitions into holes at or above the Fermi level for hot electrons emitting the photons during the allowed direct transitions within the graphene.

17. The method of claim 1, wherein the adjoining includes adjoining the atomically two dimensional material, which is a transition metal dichalcogenide having the band structure including a direct bandgap, and the dielectric layer, which is adapted to convey the variable electric field for modulating the direct bandgap via the Stark effect and thereby modulating allowed direct transitions across the direct bandgap for hot electrons emitting the photons during the allowed direct transitions within the transition metal dichalcogenide.

18. The method of claim 1 where the wavelength of the laser pulses substantially matches a thickness of the dielectric layer so that the laser pulses do not appreciably reach the underlying atomically two-dimensional material.

19. The method of claim 18 where the wavelength is at or about 193 nm.

20. The method of claim 1 where the laser illuminates the dielectric layer with a cumulative energy of at or about 4 mJ/cm$^2$.

21. A method for fabricating a device emitting light from hot electrons, the method comprising:
providing a conductive layer that is a supply of a plurality of electrons;
adjoining the conductive layer and an insulating layer, which presents a thin barrier allowing only the hot electrons out of the plurality of electrons to tunnel from the conductive layer through the thin barrier;
adjoining the insulating layer and an atomically two dimensional material having a band structure;
adjoining the atomically two-dimensional material and a dielectric layer that is not a two-dimensional material having a plurality of defects, wherein the dielectric layer is adapted to convey a variable electric field for modulating a wavelength of photons electronically emitted across the band structure of the atomically two dimensional material;
strobing a plurality of laser pulses into the dielectric layer with sufficient cumulative energy to remove a majority of the defects in the dielectric layer without altering the atomically two dimensional material; and
adjoining the dielectric layer and an electrode layer, which is adapted to apply the variable electric field via the dielectric layer to modulate the wavelength of the photons emitted when the hot electrons transition across the band structure of the atomically two-dimensional material, where the dielectric layer is amorphous, and where the defects consist of oxygen vacancies or oxygen interstitials.

22. The method of claim 21, wherein the adjoining of the atomically two-dimensional material and the dielectric layer includes adjoining to convey the variable electric field that modulates the band structure of the atomically two dimensional material and thereby modulates allowed direct transitions across the band structure for the hot electrons emitting the photons during the allowed direct transitions, with the wavelength of the photons corresponding to an energy of the allowed direct transitions.

23. The method of claim 21, wherein the dielectric layer is composed of a HfO2 or Al2O3 incorporating the defects, which include oxygen vacancies and oxygen interstitials, and wherein the strobing combines certain of the oxygen vacancies and certain of the oxygen interstitials, thereby removing the certain of the oxygen vacancies and the certain of the oxygen interstitials from the HfO2 or Al2O3 of the dielectric layer.

* * * * *